(12) United States Patent
Zha

(10) Patent No.: US 11,189,763 B2
(45) Date of Patent: Nov. 30, 2021

(54) BACKLIGHT STRUCTURE

(71) Applicant: WUHAN CHINA STAR OPTOELECTRONICS TECHNOLOGY CO., LTD., Hubei (CN)

(72) Inventor: Guowei Zha, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 301 days.

(21) Appl. No.: 16/468,284

(22) PCT Filed: Sep. 25, 2018

(86) PCT No.: PCT/CN2018/107356
§ 371 (c)(1),
(2) Date: Jun. 11, 2019

(87) PCT Pub. No.: WO2020/047914
PCT Pub. Date: Mar. 12, 2020

(65) Prior Publication Data
US 2020/0227601 A1    Jul. 16, 2020

(30) Foreign Application Priority Data
Sep. 7, 2018 (CN) .......................... 201811040611.3

(51) Int. Cl.
*H01L 21/34* (2006.01)
*H01L 33/58* (2010.01)
(Continued)

(52) U.S. Cl.
CPC ............ *H01L 33/58* (2013.01); *G06F 1/1652* (2013.01); *G09F 9/301* (2013.01); *H01L 27/156* (2013.01); *H01L 33/06* (2013.01); *H01L 33/62* (2013.01)

(58) Field of Classification Search
None
See application file for complete search history.

(56) References Cited

U.S. PATENT DOCUMENTS

| 2010/0079704 | A1* | 4/2010 | Cho | G02F 1/133617 349/71 |
| 2011/0006302 | A1* | 1/2011 | Yamazaki | H01L 27/1255 257/43 |

(Continued)

*Primary Examiner* — Joseph C. Nicely
*Assistant Examiner* — Lamont B Koo
(74) *Attorney, Agent, or Firm* — Mark M. Friedman

(57) ABSTRACT

A backlight structure is provided. The backlight structure includes a substrate, a light emitting diode array layer disposed on the substrate, a planarization layer disposed on the light emitting diode array layer, a composite medium layer disposed on the planarization layer, a metal gate line layer including a plurality of metal lines disposed on the composite medium layer, a fluorescent layer disposed on the metal gate line layer, and a diffusion layer disposed on the fluorescent layer, wherein the composite medium layer includes a first medium, a second medium, and a third medium, the second medium is interposed between the first medium and the third medium, and each of a refractive index of the first medium and a refractive index of the third medium is less than a refractive index of the second medium.

13 Claims, 3 Drawing Sheets

(51) Int. Cl.
*G06F 1/16* (2006.01)
*G09F 9/30* (2006.01)
*H01L 27/15* (2006.01)
*H01L 33/06* (2010.01)
*H01L 33/62* (2010.01)

(56) References Cited

U.S. PATENT DOCUMENTS

2011/0026274 A1* 2/2011 Bourdelais ............ G02B 6/0078
362/613
2012/0250350 A1* 10/2012 Kim .................. G02F 1/133606
362/606
2015/0146452 A1* 5/2015 Kim .................... C09K 11/883
362/611
2016/0313599 A1* 10/2016 Kwon ............... G02F 1/133514

* cited by examiner

BACKLIGHT STRUCTURE

FIELD OF INVENTION

The present disclosure relates to a backlight structure, and in particular, to a backlight structure providing selective passage or reflection of specific polarized light.

BACKGROUND OF INVENTION

With gradual rise of wearable applications, such as smart glasses and smart watches, the display industry's demand for flexible display devices is also increasing. Organic light emitting diodes (OLEDs) have characteristics, such as self-illumination without a backlight, thin thickness, wide viewing angles, and fast response speed, so as to have natural flexible display advantages. Faced with competition of flexible OLEDs, traditional liquid crystal display technology has gradually adopted flexible substrates to achieve a breakthrough in the direction of flexibility and a curved surface.

In order to meet the needs of full screens, how to achieve a comprehensive narrow perimeter around a perimeter becomes the next major breakthrough direction for display devices. On a small display device, a direct type backlight module has an advantage of a narrow bezel. If a small size sub-millimeter light emitting diode (mini-LED) is used to arrange at a smaller pitch, a smaller mixing distance can be obtained, which provides the possibility of reducing frame size.

However, the mini-LED is configured in an array of a plurality of LED units having a size of about 100 micrometers. The LED unit and a pad thereof form a low reflector with a large area ratio. High reflectivity coatings or other highly reflective material are usually covered between adjacent LED units. The high reflective material has reflectance of 70 to 90%. Therefore, the reflection efficiency can only reach about 80%, resulting in low photon efficiency and affecting brightness and power consumption levels.

As a result, it is necessary to provide a backlight structure to solve the problems existing in the conventional technologies, as described above.

SUMMARY OF THE INVENTION

An object of the present disclosure is to provide a backlight structure. By using a resin having a low absorption rate as a planarization layer, and the planarization layer is filled and covered with a light emitting diode array layer having a mini-LED array. Then, a metal gate line layer is formed with a reversed band passband on the planarization layer by depositing a medium and a metal layer having different refractive indices. The metal gate line layer is capable of selectively allowing a TM polarization state near the main wavelength of the mini-LED to pass, and reflecting other rays of other wavelengths or TE polarization states. Thereby being circulated back into the light system between the reflective sheet and the brightness enhancing sheet in the backlight structure, it can effectively reduce the light reflected by the brightness enhancement film to re-contact the low-reflection mini-LED array. The photon utilization efficiency of the backlight structure is improved to obtain a high efficiency backlight module.

To achieve the above objects, the present disclosure provides a backlight structure, the backlight structure includes a substrate, a light emitting diode array layer, a planarization layer, a composite medium layer, a metal gate line layer, a fluorescent layer, and a diffusion layer, wherein the light emitting diode array layer is disposed on the substrate and including a plurality of light emitting diodes; the planarization layer is disposed on the light emitting diode array layer and filling a gap between the light emitting diodes; the composite medium layer is disposed on the planarization layer; the metal gate line layer includes a plurality of metal lines disposed on the composite medium layer; the fluorescent layer is disposed on the metal gate line layer; the diffusion layer is disposed on the fluorescent layer; the composite medium layer includes a first medium, a second medium, and a third medium, the second medium is interposed between the first medium and the third medium, and each of a refractive index of the first medium and a refractive index of the third medium is less than a refractive index of the second medium.

In one embodiment of the present disclosure, the substrate is a flexible substrate or a printed circuit board.

In one embodiment of the present disclosure, a material of the planarization layer is selected from the group of silica gel, colorless polyimide, and polymethyl methacrylate.

In one embodiment of the present disclosure, a material of the metal lines is aluminum, silver, or gold.

In one embodiment of the present disclosure, the metal lines are arranged on the composite medium layer in a repeated cycle, the repeated cycle is 200 to 500 nm, and the metal gate line layer has a duty ratio of 0.4 to 0.9.

In one embodiment of the present disclosure, the metal lines have an average height of 20 to 200 nm.

In one embodiment of the present disclosure, the fluorescent layer includes a plurality of phosphor powders or quantum dot particles.

In one embodiment of the present disclosure, the fluorescent layer further includes a plurality of scattering particles.

In one embodiment of the present disclosure, each of the first medium and the third medium is made of a material selected from a group of silicon dioxide, silicon monoxide, and magnesium oxide.

In one embodiment of the present disclosure, a material of the second medium is selected from a group of silicon nitride, titanium dioxide, and tantalum pentoxide.

To achieve the above objects, the present disclosure provides a backlight structure, the backlight structure includes a substrate, a light emitting diode array layer, a planarization layer, a composite medium layer, a metal gate line layer, a fluorescent layer, and a diffusion layer, wherein the light emitting diode array layer is disposed on the substrate and including a plurality of light emitting diodes; the planarization layer is disposed on the light emitting diode array layer and filling a gap between the light emitting diodes; the composite medium layer is disposed on the planarization layer; the metal gate line layer includes a plurality of metal lines disposed on the composite medium layer; the fluorescent layer is disposed on the metal gate line layer; the diffusion layer is disposed on the fluorescent layer; the composite medium layer includes a first medium, a second medium, and a third medium, the second medium is interposed between the first medium and the third medium, and each of a refractive index of the first medium and a refractive index of the third medium is less than a refractive index of the second medium; each of the first medium and the third medium is made of a material selected from a group of silicon dioxide, silicon monoxide, and magnesium oxide; a material of the second medium is selected from a group of silicon nitride, titanium dioxide, and tantalum pentoxide; the metal lines are arranged on the composite medium layer in a repeated cycle, the repeated cycle is 200 to 500 nm, and the metal gate line layer has a duty ratio of 0.4 to 0.9.

In order to make the above-mentioned contents of the present disclosure more comprehensible, the preferred embodiments are described below, and in conjunction with the accompanying drawings, the detailed description is as follows.

DETAILED DESCRIPTION OF PREFERRED EMBODIMENTS

Structure and technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Figure 1:
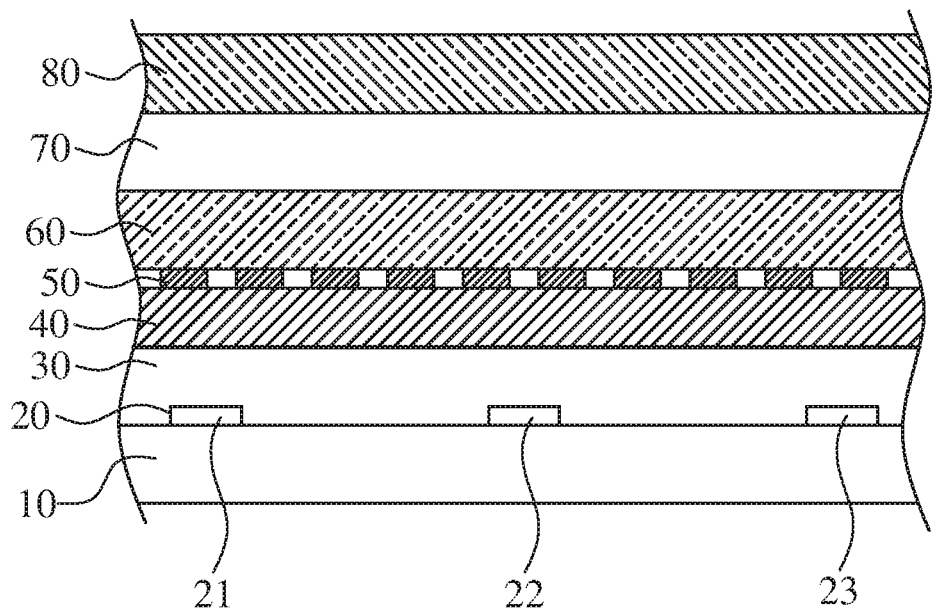
FIG. 1 is a schematic diagram of a backlight structure according to an embodiment of the present disclosure.

Referring to FIG. 1, a schematic diagram of a backlight structure according to an embodiment of the present disclosure is illustrated. The backlight structure includes a substrate 10, a light emitting diode array layer 20, a planarization layer 30, a composite medium layer 40, a metal gate line layer 50, a fluorescent layer 60, and a diffusion layer 70. The light emitting diode array layer 20 is disposed on the substrate 10. The planarization layer 30 is disposed on the light emitting diode array layer 20. The composite medium layer 40 is disposed on the planarization layer 30. The metal gate line layer 50 is disposed on the composite medium layer 40, and the metal gate line layer 50 includes a plurality of metal lines. The fluorescent layer 60 is disposed on the metal gate line layer 50. The diffusion layer 70 is disposed on the fluorescent layer 60. The light emitting diode array layer 20 includes a plurality of light emitting diodes, such as a first light emitting diode 21, a second light emitting diode 22, and a third light emitting diode 23. In an embodiment of the present disclosure, the substrate 10 is a flexible substrate or a printed circuit board (PCB), and the substrate 10 is not limited thereto. Other types of substrates that can be used in mini-LED packages are also available. The planarization layer 30 fills a gap between the light emitting diodes. In an embodiment of the present disclosure, material of the planarization layer 30 is selected from the group of silica gel, colorless polyimide, and polymethyl methacrylate (PMMA).

Preferably, the fluorescent layer 60 includes a plurality of phosphor powders or quantum dot particles, but is not limited thereto. The phosphor powders can be, for example, YAG, silicate or KSF. The quantum dot particles can be, for example, CdSe, ZnS or InP. In an embodiment of the present disclosure, in addition to the phosphor powders or the quantum dot particles, the fluorescent layer 60 further includes a plurality of scattering particles. The scattering particles are transparent and can be SiO2 or Ti2O5. The fluorescent layer 60 can exist in the form of a diaphragm and is directly fixed to an upper surface of the metal gate line layer 50 by coating.

Figure 2:
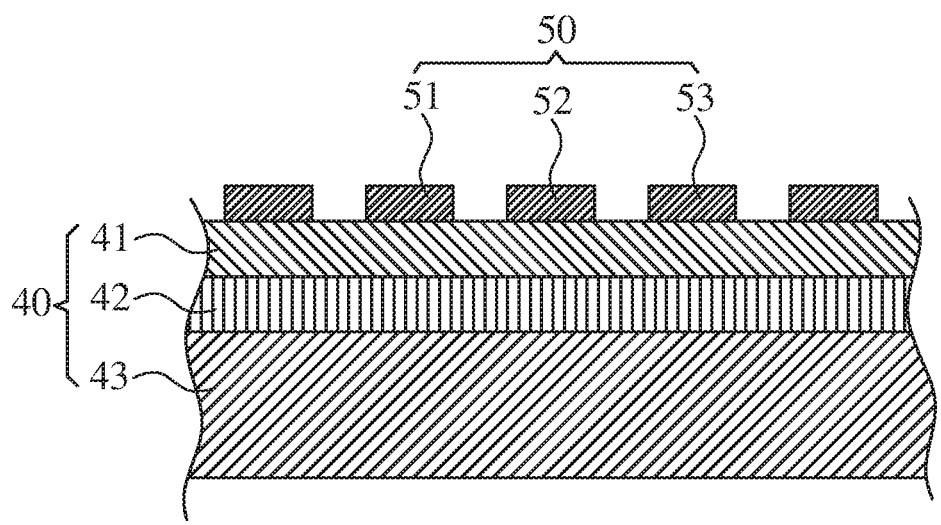
FIG. 2 is a schematic diagram of a composite medium layer and a metal gate line layer in the backlight structure according to the embodiment of the present disclosure.

Referring to FIG. 2, a schematic diagram of a composite medium layer 40 and a metal gate line layer 50 in the backlight structure according to the embodiment of the present disclosure is illustrated. Preferably, the composite medium layer 40 includes a first medium 41, a second medium 42, and a third medium 43. The second medium 42 is interposed between the first medium 41 and the third medium 43, and each of a refractive index of the first medium 41 and a refractive index of the third medium 43 is less than a refractive index of the second medium 42. The metal gate line layer 50 includes a first metal line 51, a second metal line 52, and a third metal line 53. The first metal line 51, the second metal line 52, and the third metal line 53 are arranged on the composite medium layer 50 in a repeated cycle. Preferably, the repeated cycle is 200 to 500 nm, and the metal gate line layer has a duty ratio of 0.4 to 0.9.

Preferably, each of the first medium 41 and the third medium 43 is made of a material selected from a group of silicon dioxide ($SiO_2$), silicon monoxide (SiO), and magnesium oxide (MgO), and a material of the second medium 42 is selected from a group of silicon nitride ($Si_3N_4$), titanium dioxide ($TiO_2$), and tantalum pentoxide ($Ta_2O_5$). The first medium 41, the second medium 42, and the third medium 43 can form a sandwich structure having a refractive index sequentially low, high, and low.

According to the structural design, the metal gate line layer 50 can be used as a polarizer to have a large transmission pass band for polarized light (transverse magnetic, TM). However, for polarized light (transverse electric, TE), the suppression of transmission in the full range of visible light is achieved. The polarized light TM has a polarization direction of light perpendicular to the metal gate line layer 50, and the polarized light TE has a light polarization direction parallel to the metal gate line layer 50.

In an embodiment of the present disclosure, the metal lines have an average height of 20 to 200 nm. In an embodiment of the present disclosure, material of the metal lines has a large refractive index imaginary part, such as aluminum (Al), silver (Ag), or gold (Au).

Figure 3:
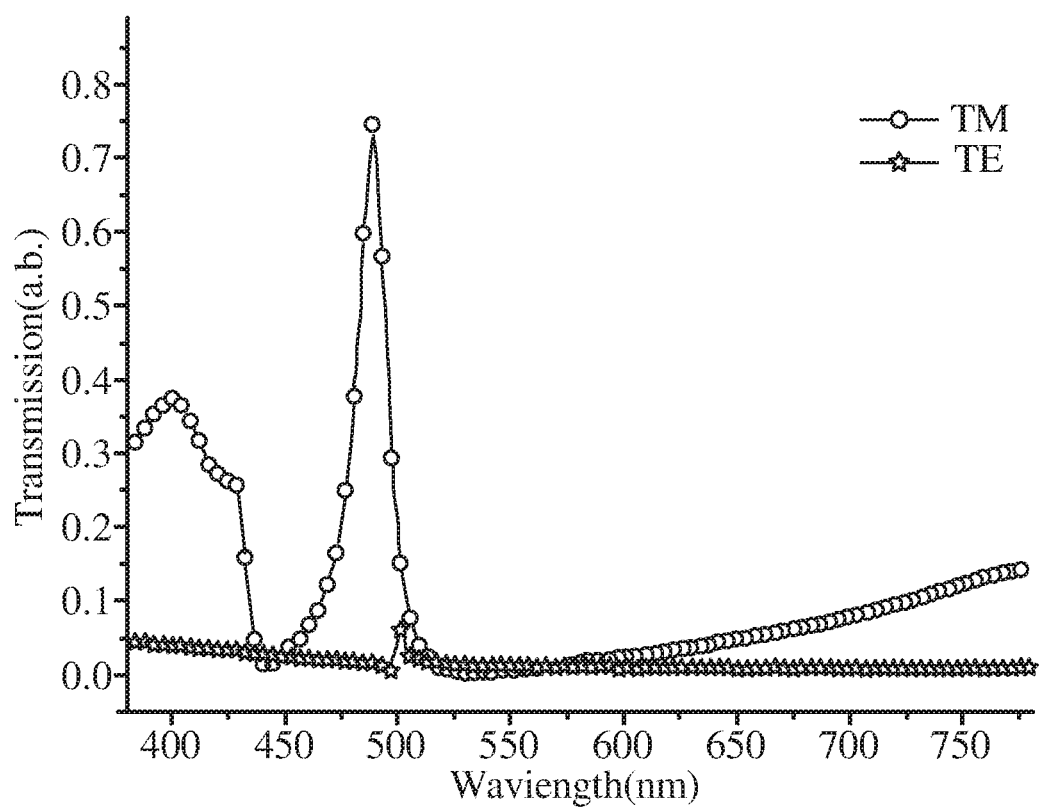
FIG. 3 is a spectrogram of transmission of polarized light TM and TE according to the embodiment of the present disclosure.

Referring to FIG. 3, a spectrogram of transmission of polarized light TM and TE according to the embodiment of the present disclosure is illustrated. In a wavelength range of visible light, the transmission of polarized light TE approaches zero and can be almost completely suppressed. The polarized light TM has the highest transmission at a wavelength of 475 to 500 nm. The modulation of a dominant wavelength of the transmission of the polarized light TM can be realized by adjusting parameters such as the repeated cycle of the metal line, the duty ratio of the metal gate line layer, and the metal line height, wherein the dominant wavelength is defined as the wavelength at which the transmission is the largest. Take a blue mini-LED as an example, the dominant wavelength of the metal gate line layer 50 having the highest transmission can be adjusted to be consistent with the mini-LED main wavelength. Thereby, the polarized light TM of the mini-LED can pass through the metal gate line layer 50, and the polarized light TE is blocked or reflected.

Figure 4:
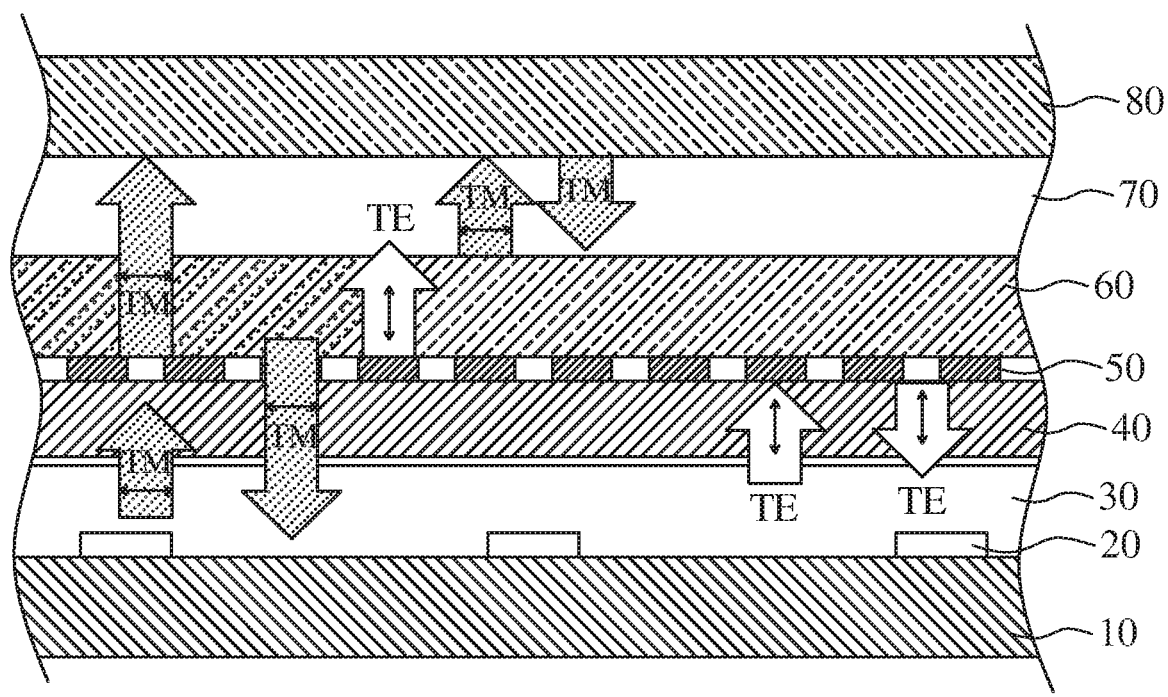
FIG. 4 is a propagation schematic diagram of polarized light TM and TE according to an embodiment of the present disclosure.

Referring to FIG. 4, a propagation schematic diagram of polarized light TM and TE according to an embodiment of the present disclosure is illustrated. Take a mini-LED as an example, polarized blue light TM can pass through the metal gate line layer 50 and excite the fluorescent layer 60 to emit yellow light (or red-green light). After the blue light and yellow light pass through a brightness enhancement film 80, a part of the light is reflected back. The yellow light is reflected by the metal gate line layer 50 and is incident toward a light-emitting direction of the brightness enhancement film 80. A part of the blue light passes through the fluorescent layer 60, and is converted into polarized blue light TE and reflected by the depolarization effect of haze particles. Only polarized blue light TM can re-pass through the metal gate line layer 50 to reach the mini-LED layer (the light emitting diode array layer 20) since all the light reflected by the brightness enhancing film 80 will re-reach the mini-LED layer. Obviously, this path can effectively avoid the loss of a photon number. Therefore, significant brightness enhancement can be achieved to achieve a high efficiency direct type backlight module.

The present disclosure has been described with preferred embodiments thereof and it is understood that many changes and modifications to the described embodiments can be carried out without departing from the scope and the spirit of the disclosure that is intended to be limited only by the appended claims.

What is claimed is:

1. A backlight structure, comprising:
   a substrate;
   a light emitting diode array layer disposed on the substrate and including a plurality of light emitting diodes;
   a planarization layer disposed on the light emitting diode array layer and filling a gap between the light emitting diodes;
   a composite medium layer disposed on the planarization layer;
   a metal gate line layer including a plurality of metal lines disposed on the composite medium layer;
   a fluorescent layer disposed on the metal gate line layer; and
   a diffusion layer disposed on the fluorescent layer;
   wherein the composite medium layer includes a first medium, a second medium, and a third medium, and, the second medium is interposed between the first medium and the third medium, and each of a refractive index of the first medium and a refractive index of the third medium is less than a refractive index of the second medium, and a material of the second medium is selected from a group of silicon nitride, titanium dioxide, and tantalum pentoxide.

2. The backlight structure according to claim 1, wherein the substrate is a flexible substrate or a printed circuit board.

3. The backlight structure according to claim 1, wherein a material of the planarization layer is selected from the group of silica gel, colorless polyimide, and polymethyl methacrylate.

4. The backlight structure according to claim 1, wherein a material of the metal lines is aluminum, silver, or gold.

5. The backlight structure according to claim 1, wherein the metal lines are arranged on the composite medium layer in a repeated cycle, the repeated cycle is 200 to 500 nm, and the metal gate line layer has a duty ratio of 0.4 to 0.9.

6. The backlight structure according to claim 1, wherein the metal lines have an average height of 20 to 200 nm.

7. The backlight structure according to claim 1, wherein the fluorescent layer includes a plurality of phosphor powders or quantum dot particles.

8. The backlight structure according to claim 7, wherein the fluorescent layer further includes a plurality of scattering particles.

9. The backlight structure according to claim 1, wherein each of the first medium and the third medium is made of a material selected from a group of silicon dioxide, silicon monoxide, and magnesium oxide.

10. A backlight structure, comprising:
    a substrate;
    a light emitting diode array layer disposed on the substrate and including a plurality of light emitting diodes;
    a planarization layer disposed on the light emitting diode array layer and filling a gap between the light emitting diodes;
    a composite medium layer disposed on the planarization layer;
    a metal gate line layer including a plurality of metal lines disposed on the composite medium layer;
    a fluorescent layer disposed on the metal gate line layer; and
    a diffusion layer disposed on the fluorescent layer;
    wherein the composite medium layer includes a first medium, a second medium, and a third medium, the second medium is interposed between the first medium and the third medium, and each of a refractive index of the first medium and a refractive index of the third medium is less than a refractive index of the second medium;
    wherein each of the first medium and the third medium is made of a material selected from a group of silicon dioxide, silicon monoxide, and magnesium oxide;
    wherein a material of the second medium is selected from a group of silicon nitride, titanium dioxide, and tantalum pentoxide; and
    wherein the metal lines are arranged on the composite medium layer in a repeated cycle, the repeated cycle is 200 to 500 nm, and the metal gate line layer has a duty ratio of 0.4 to 0.9.

11. The backlight structure according to claim 10, wherein the metal lines have an average height of 20 to 200 nm.

12. The backlight structure according to claim 10, wherein the fluorescent layer includes a plurality of phosphor powders or quantum dot particles.

13. The backlight structure according to claim 12, wherein the fluorescent layer further includes a plurality of scattering particles.

* * * * *